(12) United States Patent
Ulrey

(10) Patent No.: US 7,953,200 B2
(45) Date of Patent: May 31, 2011

(54) PHASE JUMP SEQUENCER ARCHITECTURE

(75) Inventor: Renard R. Ulrey, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 786 days.

(21) Appl. No.: 11/936,292

(22) Filed: Nov. 7, 2007

(65) Prior Publication Data

US 2009/0115483 A1    May 7, 2009

(51) Int. Cl.
*H03D 3/24* (2006.01)
(52) U.S. Cl. ....................................................... 375/376
(58) Field of Classification Search .................. 375/215, 375/294, 327, 376; 342/103; 370/503; 455/180.3, 455/266; 327/141, 146, 147, 148, 149, 150, 327/156, 157, 158, 159, 231, 233, 237
See application file for complete search history.

(56) References Cited

U.S. PATENT DOCUMENTS

2006/0245531 A1 * 11/2006 Leonowich et al. .......... 375/376
* cited by examiner

*Primary Examiner* — Sam K Ahn
(74) *Attorney, Agent, or Firm* — Luedeka, Neely & Graham, P.C.

(57) ABSTRACT

A method for controlling an output phase of a phase interpolator, by forming an M bit control word, designating N bits of the control word as a fractional number portion, designating M-N bits of the control word as a whole number portion, adjusting a phase jump of the phase interpolator at a designated clock cycle by a first number of phases as designated by the whole number portion plus a second number of phases as designated by the fractional number portion. The designated clock cycle can be identified by numbering clock cycles with a count value from counter having a repeating period of $2^N$, and for each clock cycle identified by a multiple of the count value of $2^k$ within the repeating period, where k is a bit-wise position within the fractional number portion having a value of $0 \leq k \leq N-1$, the second number of phases can equal a binary value of the fractional number portion at the $k^{th}$ position, for any k.

2 Claims, 1 Drawing Sheet

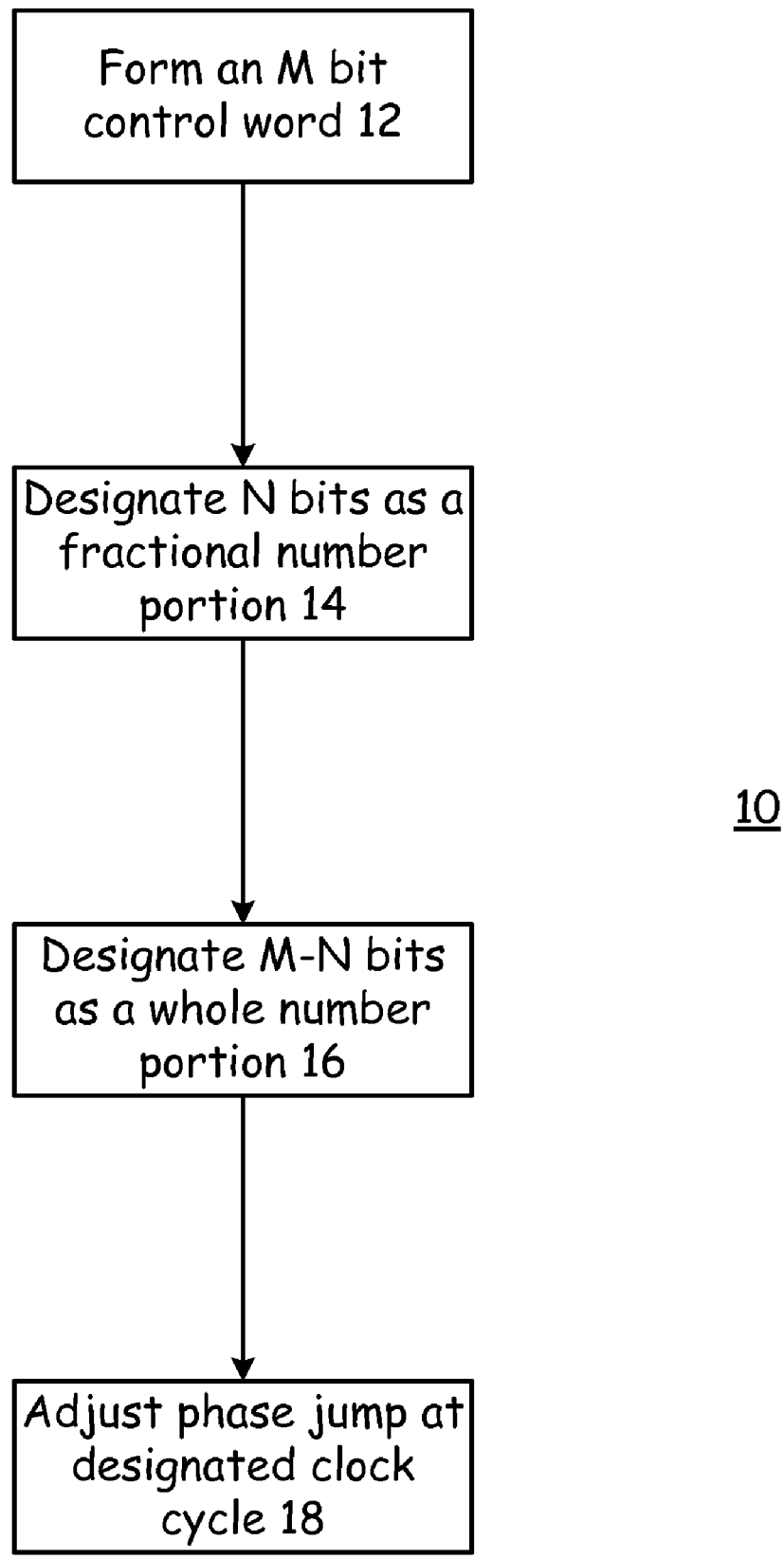

PHASE JUMP SEQUENCER ARCHITECTURE

FIELD

This invention relates to the field of integrated circuit fabrication. More particularly, this invention relates to the design of a phase sequencer for controlling a phase interpolator.

BACKGROUND

Phase interpolators take as their input a relatively small number of clock signals, which all have the same frequency, and with equally spaced phase offsets. For example, one phase interpolator might have an input of eight different clock signals, where the phases of the each of the eight different clock signals are forty-five degrees apart, one from the next. The phase interpolator can "add" the phases of the different input signals in such a way as to create an output clock signal with a selectable phase offset. The possible number of selectable output phases from the phase interpolator varies by design, such as 128 phases at 2.8125 degree spacing.

A phase sequencer can be used to select the output phase of the phase interpolator, and can operate to change the selected output phase. In some applications it is desirable that the change in the output phase of the phase interpolator is accomplished as a regularly repeating progression. By regularly sequencing the output phase of the phase interpolator, an effective frequency offset can be observed on the output of the phase interpolator with regard to the frequency of the clocks going into the phase interpolator.

Large frequency offsets can be obtained by jumping a programmed number of selectable phases every update period. The largest frequency offset is obtained by jumping the maximum number of phases possible within the shortest update period. The value of the largest offset is determined by finding (1) the maximum possible phase jump that the phase interpolator is designed to produce without either greatly distorting its output clock (such as by not providing smooth rising and falling edges) or creating a glitch on the output clock signal, and (2) how often the phase updates can occur.

For example, a given phase interpolator may have 128 selectable output phases, and be able to jump its output phase by ten phases every clock period. The maximum selectable frequency offset would then be: $+/-(10/128)=+/-7.8125\%$.

Small frequency offsets are obtained by jumping a single phase less than once per clock period. For example, by making ten single-phase jumps over a period of thirty-two clock cycles.

The precision of the frequency offset can be controlled by the design of the phase sequencer. For example, if a phase sequencer controls a 128-phase phase interpolator, and can be programmed to jump every $2^{10}$ clock cycles, the error of the frequency offset control (also called the precision of the frequency offset) is: $1/(128\times2^{10})=\frac{1}{2}^{17}$, or less than eight parts per million.

The two concepts described above, of the largest frequency offset and the smallest frequency offset, can be merged. In other words, a phase sequencer can be constructed to jump a desired number of phases every clock period, where the jump size is occasionally altered by some value (such as one) to improve the precision. For example, a sequencer can be programmed to jump four phases every three clock periods, by having a constant jump of one phase every clock period, and then increasing the jump size by one phase every third clock period, providing a phase jump sequence of $+1,+1,+2,+1,+1,+2$, and so forth.

What is needed, therefore, is a design for a phase sequencer that can control the sequenced output of a phase interpolator with a high degree of precision.

SUMMARY

The above and other needs are met by a method for controlling an output phase of a phase interpolator, by forming an M bit control word, designating N bits of the control word as a fractional number portion, designating M-N bits of the control word as a whole number portion, adjusting a phase jump of the phase interpolator at a designated clock cycle by a first number of phases as designated by the whole number portion plus a second number of phases as designated by the fractional number portion.

In various embodiments the designated clock cycle is identified by numbering clock cycles with a count value from a counter having a repeating period of $2^N$, and for each clock cycle identified by a multiple of the count value of $2^k$ within the repeating period, where k is a bit-wise position within the fractional number portion having a value of $0\leq k\leq N-1$, the second number of phases equals a binary value of the fractional number portion at the $k^{th}$ position, for any k.

DRAWINGS

Further advantages of the invention are apparent by reference to the detailed description when considered in conjunction with the figure, which depicts a flow chart of a method according to the present invention.

DETAILED DESCRIPTION

The various embodiments of the present invention provide an up/down counter that has programmable step sizes, so as to select a sequence of output phases from a phase interpolator to obtain a desired frequency offset. Because phase interpolators have a small number of phases that can be selected, when the counter attains its maximum value, it then rolls back over again to zero, to provide a continuous phase progression. For example, using a 128-phase phase interpolator and a constant update rate of one phase per clock cycle, the rollover part of the count sequence would be: . . . , 124, 125, 126, 127, 0, 1, 2, 3, . . . .

Mapping the Programmable Values

The information below describes one embodiment of the invention, as depicted by the method 10 in the figure. In various embodiments of the present invention, frequency offset values are programmed using a binary number representation, as given in block 12. Negative numbers are represented in a two's-complement format. The binary number is divided into two fields, where one field is a whole number component, as given in block 16, and the second field is a fractional number component, as given in block 14. The whole number field specifies the default number of phase jumps that the phase sequencer tells the phase interpolator to make on every clock cycle. The fractional number field specifies when the default number of phase jumps for a given clock cycle is specially adjusted, such as by adding one phase jump to the default number (if the offset value is positive), or by subtracting one phase jump from the default number (if the offset value is negative), as given in block 18.

The precision of the frequency offset is determined by the bit-length of the fractional field portion of the offset value. If the fractional field is eight bits long, for example, the phase sequencer can adjust the default number of phase jumps a desired number of times within a repeating period of $2^8=256$ cycles. A fractional field that is ten bits long allows the phase sequencer to adjust the default number of phase jumps a desired number of times within a repeating period of $2^{10}=1,024$ cycles.

EXAMPLE

If the frequency offset value is 01010001011, where the whole number field is the first three bits of the value (010), and the fractional number field is the last eight bits of the value (10001011), this is interpreted as a default jump size of two (the value of the whole number field) every clock cycle, with 139 (the value of the fractional number) out of every $2^8=256$ (eight being the bit-length of the fractional number field) cycles having a jump size of 2+1=3, where two is the default jump size and one is offset size. In some embodiments a different offset size could be programmed into the phase sequencer. This sequence repeats every $2^8=256$ cycles.

The fractional number field can be further broken down for better understanding of the architecture of this embodiment of the present invention. Each bit in the fractional value can be evaluated independently to see how it affects the phase jumps. The fractional value in the example above, 10001011, can be rewritten as $2^7+2^3+2^1+2^0$, because there is a value of one in the zeroeth, first, third, and seventh positions of the field. The $2^7$ value means that the default phase jump is adjusted every $2^7/2^8=2$ cycles (where the eight represents the bit-length of the factional value). Similarly, the $2^3$ value means that the default phase jump is also adjusted every $2^3/2^8=32$ cycles. Continuing this logic, the $2^1$ value means that the default phase jump is also adjusted every $2^1/2^8=128$ cycles, and the $2^0$ value means that the default phase jump is also adjusted every $2^0/2^8=256$ cycles.

Main Architecutrue of the Invention

The embodiments of the present invention achieve two benefits. The first is to implement the regularly repeating sequence of jumps, and the second is to provide a way to evenly distribute the adjustments to the default jump size so that the clock frequency observed at the output of the phase interpolator has the smallest obtainable frequency discontinuities (single phase adjustments), and these discontinuities are evenly distributed over time.

The architecture used in some embodiments to create the evenly distributed sequence of adjustments to the default phase jump uses a free running counter that is the same bit-length as the fractional number field. An algorithm is implemented in hardware to observe both the current value of the counter and the value of the fractional number field. In the algorithm, the $k^{th}$ bit of the fractional number field is observed upon the assertion of the $(N-1-k)^{th}$ bit of the counter, where $0 \leq k \leq N-1$, and N is the number of bits in the counter and in the fractional number field. This observation occurs for all N bits simultaneously, and the OR of the resulting comparisons specifies on which clock cycle an adjustment to the default phase jump is made.

An example is given in the table below that gives a visual look at how the algorithm distributes the programmed phase jump adjustments. In the example, the bit-length of both the counter and the fractional number field is four. The programmed fractional value is 1101 (binary). The result of the programmed fractional value is that $2^3+2^2+2^0=13$ out of every $2^4=16$ clock cycles will have an adjustment to the default phase jump, where the adjustment sequence repeats every sixteen clock cycles. The table below shows how and when (at the assertion of the corresponding count bit) the bits of the fractional number field are compared with the count value. Empty cells in the table are assumed to have a value of zero, and are omitted for easier reading of the table.

| Count Number | Fractional Number Field | | | | OR Result |
|---|---|---|---|---|---|
| (Clock Cycle) | 1 | 1 | 0 | 1 | |
| 0000 | | | | | 0 |
| 0001 | 1 | | | | 1 |
| 0010 | | 1 | | | 1 |
| 0011 | 1 | | | | 1 |
| 0100 | | | 0 | | 0 |
| 0101 | 1 | | | | 1 |
| 0110 | | 1 | | | 1 |
| 0111 | 1 | | | | 1 |
| 1000 | | | | 1 | 1 |
| 1001 | 1 | | | | 1 |
| 1010 | | 1 | | | 1 |
| 1011 | 1 | | | | 1 |
| 1100 | | | 0 | | 0 |
| 1101 | 1 | | | | 1 |
| 1110 | | 1 | | | 1 |
| 1111 | 1 | | | | 1 |

One implementation of the algorithm for this 4-bit example is given in the following pseudo-code. There are different ways to determine the assertion of the corresponding count bit (counter_val[*] below).

```
distribute[3] = fractional_field[3] &         // @ counts 1,3,5,7,9,11,13,15
               counter_val[0];
distribute[2] = fractional_field[2] &         // @ counts 2,6,10,14
               counter_val[1] &
               ~counter_val[0];
distribute[1] = fractional_field[1] &         // @ counts 4,12
               counter_val[2] &
               ~counter_val[1] &
               ~counter_val[0];
distribute[0] = abs_partial_offset[0] &       // @ count 8
               counter_val[3] &
               ~counter_val[2] &
               ~counter_val[1] &
               ~counter_val[0];
jump_adjust = distribute[3] |
             distribute[2] |
             distribute[1] |
             distribute[0];
```

The discussion above describes an embodiment for an architecture that is used when the programmed offset value is positive. Two different embodiments can be used when the programmed offset value is negative. The first embodiment is to add a step at the beginning of the process that calculates the two's complement of the programmed value so that the fractional number field used in the algorithm becomes the absolute value of the programmed fractional number field. The occasional jump size adjustments then become adjustments of −1 rather than +1.

The second embodiment simplifies the logic, but loses precision. This method is to perform the algorithm with simply the inverted value of the fractional number field. This saves the step of having to add one while calculating the two's complement. But, since the one is not added, the frequency offset adjustment is off by one step every repetition of the frequency adjustment sequence. For example, if the fractional number field is thirteen bits in length and the phase interpolator has 128 phases of resolution, the error of the offset adjustment is $1/(128 \times 2^{13}) = 1/2^{20}$ (less than one part per million). This may be accurate enough, depending on the implementation.

Thus, the various embodiments of the present invention can be used for creating a frequency offset, and provide "programmable" precision as determined by the value selected for N. In addition, the methods are able to create the smallest obtainable frequency discontinuities at the output of the interpolator (single phase adjustments), and evenly distribute the frequency discontinuities over time.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for controlling an output phase of a phase interpolator, the method comprising the steps of:
    forming an M bit control word,
    designating N bits of the control word as a fractional number portion,
    designating M-N bits of the control word as a whole number portion, wherein M and N are integers,
    adjusting a phase jump of the phase interpolator at a designated clock cycle, by
        a default number of phase jumps as specified by the whole number portion, plus
        an additional number of phase jumps as specified by the fractional number portion when the designated clock cycle is specially designated, by adding the additional number of phase jumps to the default number when the control word is positive, and by subtracting the additional number of phase jumps from the default number when the control word is negative.

2. A method for controlling an output phase of a phase interpolator, the method comprising the steps of:
    forming an M bit control word,
    designating N bits of the control word as a fractional number portion,
    designating M-N bits of the control word as a whole number portion, wherein M and N are integers, and
    adjusting a phase jump of the phase interpolator at a designated clock cycle, by a first number of phases as designated by the whole number portion, plus a second number of phases as designated by the fractional number portion, wherein,
    the designated clock cycle is identified by numbering clock cycles with a count value from a counter having a repeating period of $2^N$, and
    for each clock cycle identified by a multiple of the count value of $2^k$ within the repeating period, where k is a bit-wise position within the fractional number portion having a value of $0 \leq k \leq N-1$, the second number of phases equals a binary value of the fractional number portion at the $k^{th}$ position, for any k.

* * * * *